(12) United States Patent
Kanda et al.

(10) Patent No.: US 7,501,068 B2
(45) Date of Patent: Mar. 10, 2009

(54) METHOD FOR MANUFACTURING RESONATOR

(75) Inventors: Atsuhiko Kanda, Hyogo (JP); Naohiro Tsurumi, Kyoto (JP); Kazuhiro Yahata, Osaka (JP); Yasuhiro Uemoto, Shiga (JP); Tsuyoshi Tanaka, Osaka (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 527 days.

(21) Appl. No.: 11/109,864

(22) Filed: Apr. 20, 2005

(65) Prior Publication Data

US 2005/0255234 A1 Nov. 17, 2005

(30) Foreign Application Priority Data

Apr. 23, 2004 (JP) ............................. 2004-128921

(51) Int. Cl.
*C23F 1/00* (2006.01)
(52) U.S. Cl. ............................. 216/2; 216/11; 29/25.35; 333/187; 156/60
(58) Field of Classification Search ................ 29/25.35; 333/187; 216/2, 11
See application file for complete search history.

(56) References Cited

U.S. PATENT DOCUMENTS

| | | | |
|---|---|---|---|
| 5,789,845 A | 8/1998 | Wadaka et al. | |
| 5,864,261 A * | 1/1999 | Weber | 333/187 |
| 6,349,454 B1 * | 2/2002 | Manfra et al. | 29/25.35 |
| 6,384,697 B1 | 5/2002 | Ruby | |
| 6,839,946 B2 | 1/2005 | Ylilammi et al. | |
| 2002/0066524 A1 * | 6/2002 | Kagawa et al. | 156/235 |
| 2003/0057806 A1 * | 3/2003 | Peczalski | 310/324 |
| 2003/0199105 A1 * | 10/2003 | Kub et al. | 438/3 |

FOREIGN PATENT DOCUMENTS

| | | |
|---|---|---|
| EP | 1 124 328 A1 | 8/2001 |
| JP | 08-148968 | 6/1996 |
| JP | 11-163654 | 6/1999 |
| JP | 2000-079686 | 3/2000 |
| JP | 2000-228547 | 8/2000 |
| JP | 2001-274358 | 10/2001 |
| JP | 2001-274650 | 10/2001 |
| JP | 2002-509644 A | 3/2002 |
| JP | 2002-114570 | 4/2002 |
| JP | 2003309301 A * | 10/2003 |

OTHER PUBLICATIONS

Japanese Office Action, issued in corresponding Japanese Patent Application No. 2004-128921, mailed on Oct. 5, 2007.

* cited by examiner

*Primary Examiner*—Roberts Culbert
(74) *Attorney, Agent, or Firm*—McDermott Will & Emery LLP

(57) ABSTRACT

A method for manufacturing a resonator of the present invention includes the steps of (a) forming a resonator film including a piezoelectric film made of piezoelectric material and (b) preparing a resonator substrate for supporting the resonator film. The method further comprises the step of (c) bonding the resonator film formed in the step (a) and the resonator substrate prepared in the step (b).

13 Claims, 9 Drawing Sheets

METHOD FOR MANUFACTURING RESONATOR

CROSS-REFERENCE TO RELATED APPLICATION

This non-provisional application claims priority under 35 U.S.C. §119(a) on Patent Application No. 2004-128921 filed in Japan on Apr. 23, 2004, the entire contents of which are hereby incorporated by reference.

BACKGROUND OF THE INVENTION (a) Field of the Invention

The present invention relates to a method for manufacturing a resonator which is applicable to filters for electronic circuits. In particular, it relates to a method for manufacturing a film bulk acoustic resonator.

(b) Description of Related Art

Film bulk acoustic resonators (hereinafter referred to as FBARs) have been used for high frequency filters of high performance. In recent years, with a decrease in size and an increase in frequency band of high frequency devices such as cellular phones, expectations have been placed on the application of the FBARs.

In the manufacture of the FBARs, the most important step is to form a structure for resonating acoustic waves. Such a structure has been formed by known methods, for example, by forming a trench from the bottom surface of a substrate to a lower electrode by etching, forming an air gap (air bridge) or forming a multilayer acoustic film.

Hereinafter, with reference to FIGS. 8 and 9, an explanation is given for examples of the conventional methods for forming the FBARs.

CONVENTIONAL EXAMPLE 1

FIGS. 8A to 8E show a method for manufacturing a resonator of Conventional Example 1 (see the specification of U.S. Pat. No. 6,384,697).

First, as shown in FIG. 8A, a resist film is applied to a resonator substrate 100 made of silicon and patterned into a resist pattern 101. Then, using the resist pattern 101 as a mask, the resonator substrate 100 is etched to form a concave 102.

The resist pattern 101 is removed and a sacrificial layer 103 made of silicon and oxygen is deposited on the resonator substrate 100 to fill the concave 102 as shown in FIG. 8B. Then, the sacrificial layer 103 is planarized by chemical mechanical polishing (CMP) as shown in FIG. 8C to provide a sacrificial layer region 104 filled with the sacrificial layer 103 to be removed in a later step.

Further, a lower electrode 105 is formed on the resonator substrate 100 and the sacrificial layer region 104 as shown in FIG. 8D and then a piezoelectric (PZ) film 106 and an upper electrode 107 are formed on the lower electrode 105 in this order. The lower electrode 105 and the piezoelectric film 106 are then etched to form a via hole 108 for forming an air gap.

Then, as shown in FIG. 8E, the sacrificial layer 103 in the sacrificial layer region 104 is removed at high speed using hydrofluoric acid (HF) through the via hole 108. Thus, an air gap 109 is formed.

CONVENTIONAL EXAMPLE 2

FIGS. 9A to 9F illustrate a method for manufacturing a resonator of Conventional Example 2 (see Japanese Unexamined Patent Publication No. 2002-509644).

First, as shown in FIG. 9A, a sacrificial layer 201 made of a polymer is deposited on a resonator substrate 200. Then, the sacrificial layer 201 is etched using a resist pattern formed thereon as a mask to provide a sacrificial layer region 202 including the sacrificial layer 201 to be removed in a later step.

Then, an insulating protective film 203 is deposited over the resonator substrate 200 and the sacrificial layer region 202 as shown in FIG. 9C. Then, as shown in FIG. 9D, a lower electrode 204 is formed on a certain region of the insulating protective film 203. Subsequently, a piezoelectric (PZ) film 205 and an upper electrode 206 are formed in this order on the insulating protective film 203 and the lower electrode 204.

Further, the upper electrode 206, piezoelectric film 205, lower electrode 204 and insulating protective film 203 are etched to form a via hole 207 for forming an air gap as shown in FIG. 9E.

Then, as shown in FIG. 9F, the sacrificial layer region 202 is etched through the via hole 207 to remove the sacrificial layer 201 in the sacrificial layer region 202. Thus, an air gap 208 is formed.

SUMMARY OF THE INVENTION

Both of the above-described conventional methods for forming the FBARs involve the complicated step of forming the piezoelectric film and the like on the bottommost sacrificial layer and then etching the sacrificial layer to form the air gap below the piezoelectric film. The manufacture of the FBARs requires a large number of complicated steps, thereby decreasing a step yield. Further, since the sacrificial layer is etched after the piezoelectric film has been formed, the piezoelectric film is damaged by the etching. This brings about deterioration in performance of the FBARs. Moreover, in the conventional methods for manufacturing the FBARs, the piezoelectric film is formed directly on the resonator substrate. Therefore, limitations are imposed on how to form the piezoelectric film.

In view of the above problems, an object of the present invention is to allow the manufacture of a high performance resonator with high yield and low cost by simplifying the complicated steps of manufacturing the resonator including the step of forming the sacrificial layer.

To achieve the object, the present invention provides a method for manufacturing a resonator comprising the step of bonding a resonator film including a piezoelectric film made of piezoelectric material and a resonator substrate for supporting the resonator film.

More specifically, the method for manufacturing a resonator of the present invention comprises the steps of: (a) forming a resonator film including a piezoelectric film made of piezoelectric material; (b) preparing a resonator substrate for supporting the resonator film; and (c) bonding the resonator film and the resonator substrate.

The present method for manufacturing the resonator allows forming the resonator film on a substrate other than the support substrate. Therefore, the resonator film is formed with high crystallinity. Further, since the resonator substrate or the resonator film is formed with a part to be an air gap in advance, the air gap is easily formed below the resonator film without forming or removing the sacrificial layer. Thus, the resonator is obtained with great ease.

In the present method for manufacturing the resonator, the resonator film is preferably a resonator film for a film bulk acoustic resonator.

In the present method for manufacturing the resonator, it is preferable that the step (a) is the step of forming the resonator film on the main surface of a preparation substrate and the step (c) is the step of bonding the resonator film to the main surface of the resonator substrate.

Since the method is so constructed, the steps for manufacturing the resonator are drastically simplified. Further, since the air gap is formed in advance in the resonator substrate, there is no need of the etching step after the formation of the resonator film including the piezoelectric film. This prevents the piezoelectric film from being damaged. Moreover, since the piezoelectric film is formed on the preparation substrate different from the resonator substrate, a wide choice of the preparation substrate is offered. Thus, the piezoelectric film is obtained with high quality by epitaxial growth.

In the present method for manufacturing the resonator, the step (a) preferably includes the step of (d) forming the piezoelectric film made of piezoelectric material on the main surface of the preparation substrate. By so doing, the resonator film is obtained with reliability.

In the present method for manufacturing the resonator, the step (d) is preferably the step of forming the piezoelectric film by epitaxial growth. By so doing, the piezoelectric film is obtained with high quality.

In the present method for manufacturing the resonator, the step (d) is preferably the step of forming the piezoelectric film by sputtering. By so doing, the resonator film is obtained easily.

The piezoelectric film is preferably made of aluminum nitride (AlN), zinc oxide (ZnO) or lead zirconate titanate (PZT). If such material is used as the piezoelectric film, the piezoelectric film of high performance is obtained with reliability.

In the present method for manufacturing the resonator, the step (a) preferably includes the step of (e) forming a first thin film between the main surface of the preparation substrate and the piezoelectric film prior to the step (d) of forming the piezoelectric film. By so doing, the resonator film is surely peeled off the preparation substrate and damage to the resonator film caused upon peeling is reduced.

The step (e) may be the step of forming an insulating film or a conductive film. Further, the step (e) may be the step of forming a layered film of a conductive film and an insulating film.

In the present method for manufacturing the resonator, the step (a) preferably includes the step of (f) forming a second thin film on the piezoelectric film. This improves adhesion between the resonator film and the resonator substrate.

The step (f) may be the step of forming an insulating film or a conductive film. Further, the step (f) may be the step of forming a layered film of a conductive film and an insulating film.

In the present method for manufacturing the resonator, the step (a) preferably includes the step of removing part of the second thin film to form an opening in the second thin film. According to the thus constructed method, the air gap is formed upon bonding the resonator film and the resonator substrate without forming any sacrificial layer. Further, the air gap is provided with high dimensional precision.

In the present method for manufacturing the resonator, the step (b) preferably includes the step of (g) forming a third thin film on the main surface of the resonator substrate. This improves adhesion between the resonator film and the resonator substrate.

In the present method for manufacturing the resonator, the step (b) preferably includes the step of removing part of the third thin film to form an opening in the third thin film. According to the thus constructed method, the air gap is formed upon bonding the resonator film and the resonator substrate without forming any sacrificial layer. Further, the air gap is provided with high dimensional precision.

The step (g) may be the step of forming an insulating film or a conductive film. Further, the step (g) may be the step of forming a layered film of a conductive film and an insulating film.

In the present method for manufacturing the resonator, the step (b) preferably includes the step of (h) forming a hole or a concave in the resonator substrate. This allows forming the air gap in the resonator with reliability.

The step (h) may be the step of selectively irradiating the resonator substrate with a laser beam or the step of selectively wet-etching the resonator substrate.

In the present method for manufacturing the resonator, the step (b) preferably includes the step of forming a multilayer acoustic film made of fourth thin films and fifth thin films alternately stacked on the main surface of the resonator substrate and the fifth thin films are lower in acoustic impedance than the fourth thin films.

According to the thus constructed method, the resonator is obtained easily without forming the air gap below the resonator film.

The fourth thin films and the fifth thin films preferably have a thickness corresponding to one fourth of the resonance wavelength of the resonator, respectively. This allows forming the multilayer acoustic film with reliability.

In this case, the piezoelectric film preferably has a thickness corresponding to one half of the resonance wavelength of the resonator. By so doing, the multilayer acoustic film confines elastic waves in the piezoelectric film with high efficiency. Thus, the resonator is provided with high performance.

The fourth thin films are preferably made of silicon oxide ($SiO_2$) and the fifth thin films are preferably made of aluminum nitride (AlN), zinc oxide (ZnO), lead zirconate titanate (PZT) or tungsten (W). By so doing, the multilayer acoustic film is provided with high performance.

It is preferred that the present method for manufacturing the resonator further comprises the step of (i) peeling the preparation substrate prior to the step (c). This allows providing a simple method for manufacturing the resonator.

The step (i) is preferably carried out by laser lift-off, wet etching or dry etching.

In the present method for manufacturing the resonator, the air gap is provided without forming any sacrificial layer. Therefore, a film bulk acoustic resonator is obtained with great ease. Further, since the piezoelectric film may be formed by epitaxial growth, the obtained piezoelectric film is given with uniform crystallinity and thickness. As a result, the step of adjusting the resonator is simplified.

DETAILED DESCRIPTION OF THE INVENTION

Embodiment 1

Referring to FIG. 1A to 1E, an explanation is given for Embodiment 1 of the present invention. FIGS. 1A to 1E schematically illustrate the steps of manufacturing a film bulk acoustic resonator (FBAR) of this embodiment.

Figure 1A:
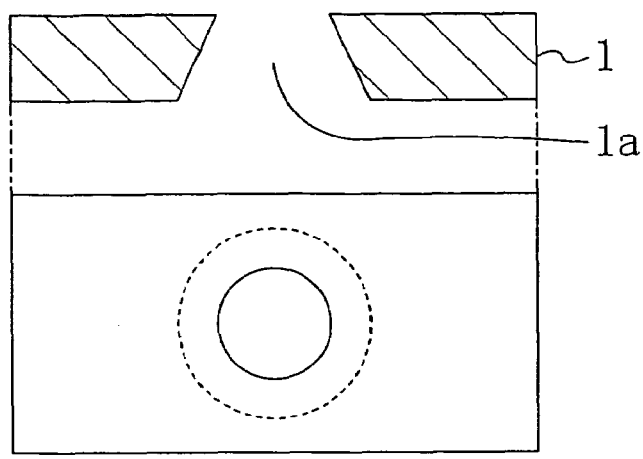
FIG. 1A shows a sectional view and a plan view illustrating one of the steps of a method for manufacturing a resonator according to Embodiment 1 of the present invention.

First, as shown in FIG. 1A, a resonator substrate 1 made of silicon (Si) is irradiated with the third harmonic of a yttrium aluminum garnet (YAG) laser (wavelength: 355 nm, output: 300 $J/cm^2$) to form a through hole 1a penetrating the resonator substrate 1.

Figure 1B:
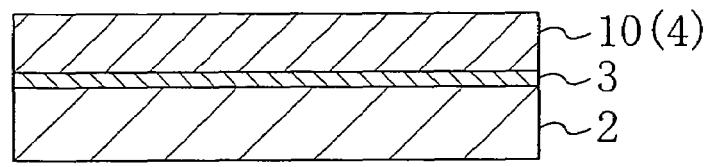
FIGS. 1B to 1E are sectional views illustrating the steps of the method for manufacturing a resonator according to Embodiment 1 of the present invention.

Then, as shown in FIG. 1B, a buffer layer 3 made of gallium nitride (GaN) is formed on a preparation substrate 2 made of silicon carbide (SiC). Then, a piezoelectric film 4 made of aluminum nitride (AlN) is deposited thereon by epitaxial growth. In this embodiment, the piezoelectric film 4 solely serves as a resonator film 10.

Figure 1C:
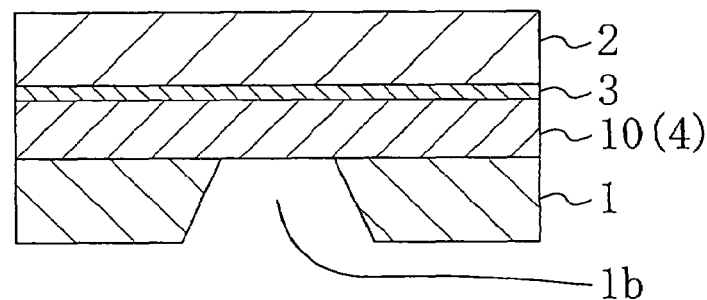

The resonator film 10 is brought into close contact with the main surface of the resonator substrate 1 and then heated at 375° C. for 10 minutes so that the resonator film 10 is bonded to the resonator substrate 1 as shown in FIG. 1C. The resulting structure includes an air gap 1b formed below the resonator film 10.

Figure 1D:
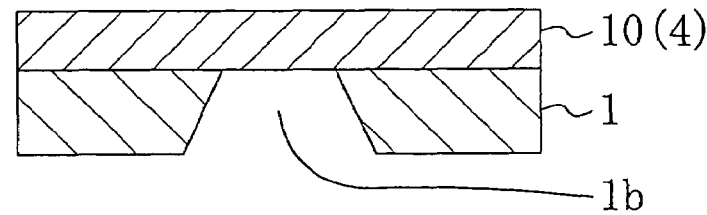

Then, as shown in FIG. 1D, the preparation substrate 2 is peeled off the resonator film 10 by laser lift-off. For example, a laser of such a wavelength that is absorbed not in the preparation substrate 2 but in the GaN buffer layer 3 (e.g., a YAG laser of 355 nm wavelength) is applied to the preparation substrate 2 to fuse the GaN buffer layer 3 into Ga and N. Thus, the preparation substrate 2 is peeled off the resonator film 10.

Figure 1E:
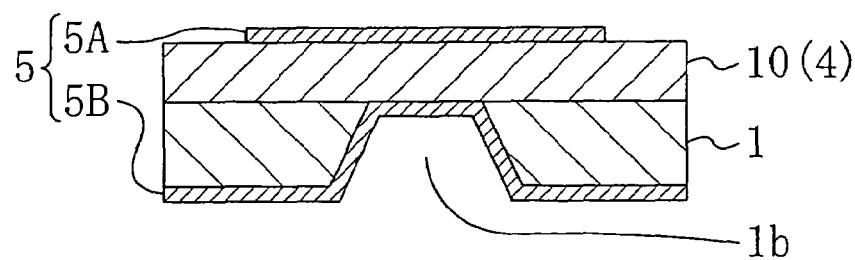

Finally, as shown in FIG. 1E, electrodes 5 made of molybdenum (Mo) are formed on the upper surface and the lower surface of the resulting resonator film 10, respectively. The electrodes 5 in this embodiment include an upper electrode 5A and a lower electrode 5B formed on the top surface and the bottom surface of the resonator film 10, respectively.

As described above, according to the method for manufacturing the FBAR of this embodiment the resonator film 10 formed on the preparation substrate 2 is bonded to the resonator substrate 1 which has been provided with the air gap 1b in advance. Therefore, there is no need of forming a sacrificial layer for forming the air gap 1b in the resonator substrate 10 or the resonator film 10 and the manufacturing steps are simplified. For example, a conventional method using the sacrificial layer requires at least 100 steps to form a resonator of the same structure as that obtained by the manufacturing method of this embodiment. However, the method of this embodiment reduces the number of steps to 80, realizing a 20% or more decrease in the number of steps.

Further, since there is no need of removing the sacrificial layer by etching, the resonator film 10 will not be damaged. Therefore, a high performance resonator is obtained with ease.

In the method for manufacturing the FBAR of this embodiment, the epitaxially grown piezoelectric film 4 made of AlN shows less variations in crystallinity and thickness. Therefore, an adjustment of the resonance frequency to the desired value, which is carried out after the formation of the resonator, is simplified.

For the epitaxial growth of the piezoelectric film made of AlN, it is necessary for the substrate to be made of SiC. However, since SiC is considerably expensive as compared with commonly used Si, the use of SiC for forming the FBAR is not practical on the cost front. Further, because of its poor workability, SiC is not suitable as a substrate for forming the FBAR in which an air gap shall be formed with high precision. Therefore, in the conventional method for forming the FBAR which involves direct deposition of the piezoelectric film on the resonator substrate, the epitaxially grown piezoelectric film cannot be employed.

On the other hand, the method for manufacturing the FBAR of this embodiment employs a bonding technique. Therefore, the preparation substrate 2 for forming the piezoelectric film 4 thereon may be made of other material than that of the resonator substrate 1. Accordingly, inexpensive Si having high workability is used as the resonator substrate 1, while SiC suitable for epitaxial growth of the piezoelectric film 4 is used as the preparation substrate 2. Further, the preparation substrate 2 can be reused after peeling the piezoelectric film 4.

In the method for manufacturing the resonator of this embodiment, the electrodes 5 are formed after the epitaxial growth of the piezoelectric film 4. This eliminates the need of considering the heat resistance of the electrode material. Therefore, although the electrodes 5 of this embodiment are made of Mo, any material can be used as the electrodes 5 as required.

For example, if tungsten (W) or iridium (Ir) having high acoustic impedance is used as the electrode material, the Q value of the obtained resonator increases. On the other hand, if aluminum (Al) or copper (Cu) having low resistance is used as the electrode material, loss by electrical resistance is reduced and the electrodes are thinned down, thereby increasing the frequency band of the resonator. Further, if stable metal such as gold (Au) is used as the electrode material, the electrodes 5 are prevented from deterioration in characteristic and adhesion to the film is enhanced. Thus, the resonator is obtained with high reliability.

In this embodiment, the electrodes 5 are single-layered. However, the electrodes 5 may be multilayered using the above-mentioned electrode materials in combination. In this case, the electrodes are given with a high Q value and low resistance. Further, a dielectric film may be interposed between the piezoelectric film 4 and the electrodes 5.

In this embodiment, the through hole 1a is formed using the YAG laser. However, it may be formed with a krypton fluoride (KrF) excimer laser (wavelength: 248 nm, output: 600 $mJ/cm^2$).

The through hole 1a may also be formed by patterning the resonator substrate using a silicon oxide ($SiO_2$) film as a mask and then wet-etching the resonator substrate using a high temperature potassium hydroxide (KOH) solution. Or alternatively, the through hole 1a may be formed by dry etching using a fluorine-based gas such as $SF_6$ or $CF_4$ as an etching gas. Instead of forming the through hole 1a, a concave which does not penetrate the substrate may be formed by controlling the etching time.

In this embodiment, the air gap 1b is provided as a round through hole. However, the shape of the air gap 1b may be changed easily using the above-described methods. For example, if the air gap 1b is in the form of a rectangle or a pentagon whose sides are not parallel to each other so that it reduces unwanted resonant oscillation in the lateral mode, deterioration in characteristic due to the unwanted resonance is eliminated (e.g., an increase in loss due to energy loss or deterioration in filtering characteristic due to unwanted resonance in a desired frequency band).

First Alternative Example of Embodiment 1

Hereinafter, with reference to FIGS. 2A to 2D, an explanation is given for a first alternative example of Embodiment 1. FIGS. 2A to 2D schematically illustrate the method for manufacturing the resonator of this alternative example. In FIGS. 2A to 2D, the same components as those shown in FIGS. 1A to 1E are given with the same reference numerals. In this alternative example, the steps prior to the step of forming the through hole 1a in the resonator substrate 1 are the same as those in Embodiment 1 and therefore the explanation thereof is omitted.

Figure 2A:
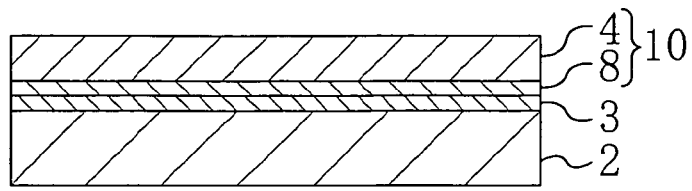
FIGS. 2A to 2D are sectional views illustrating the steps of a method for manufacturing a resonator according to a first alternative example of Embodiment 1 of the present invention.

First, as shown in FIG. 2A, a buffer layer 3 made of GaN is formed on a preparation substrate 2 made of SiC. Then, an insulating film made of silicon oxide ($SiO_2$) as a first thin film 8 and a piezoelectric film 4 made of AlN are deposited thereon to form a resonator film 10.

Figure 2B:
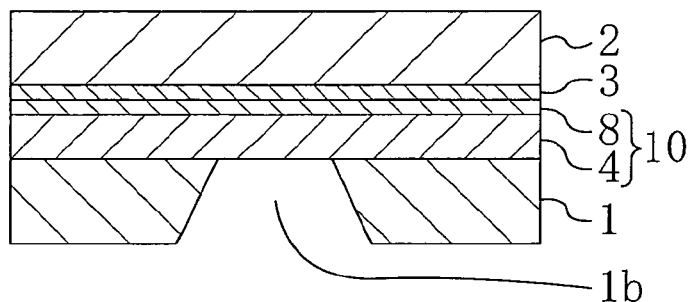

Then, the main surface of the resonator substrate 1 and the main surface of the preparation substrate 2 are faced to each other. The resonator film 10 is brought into close contact with the resonator substrate 1 and heated at 375° C. for 10 minutes, thereby bonding the resonator film 10 to the resonator substrate 1 as shown in FIG. 2B. The resulting structure includes an air gap 1b formed below the resonator film 10.

Figure 2C:
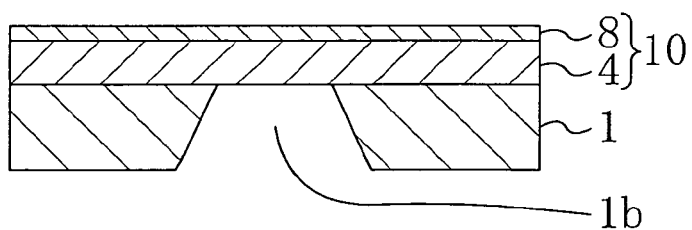

Then, a YAG laser or the like is applied to the preparation substrate 2 to fuse the buffer layer 3, thereby peeling the preparation substrate 2 off the resonator film 10 as shown in FIG. 2C.

Figure 2D:
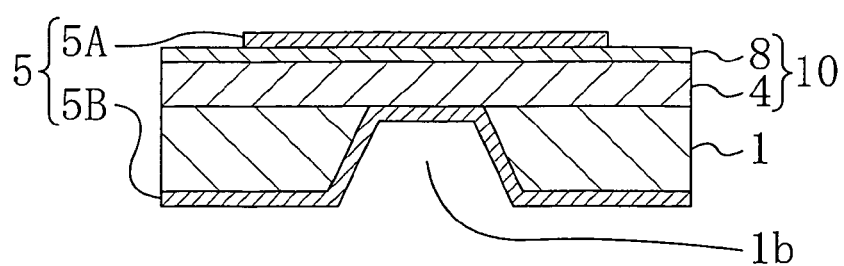

Finally, as shown in FIG. 2D, an upper electrode 5A and a lower electrode 5B made of Mo are formed on the upper and lower surfaces of the resonator film 10, respectively, by common vacuum deposition.

In this alternative example, the first thin film 8 is formed between the buffer layer 3 and the piezoelectric film 4. Therefore, the piezoelectric film 4 is prevented from being damaged upon peeling the preparation substrate 2 off the resonator film 10. Further, upon peeling of the preparation substrate 2 off the resonator film 10, the unwanted buffer layer 3 will not remain on the resonator film 10, i.e., a so-called film residue is prevented.

If the piezoelectric film 4 is made of material having a negative temperature coefficient such as zinc oxide (ZnO), $SiO_2$ or the like having a positive temperature coefficient is used as the first thin film 8. This suppresses variations in resonance frequency due to temperature.

In this alternative example, the first thin film 8 is made of $SiO_2$, but it may be made of silicon nitride (SiN) or the like. Further, the upper electrode 5A is formed on the first thin film 8, but it may be formed after the first thin film 8 is etched away. Or alternatively, the etch amount of the first thin film 8 may be adjusted to control the thickness of the resonator film 10, thereby making a fine adjustment to the resonant frequency of the resonator.

If the first thin film 8 is a conductive film of Mo or the like, it may be used as the upper electrode 5A. The first thin film 8 may be formed of a conductive film and an insulating film.

Second Alternative Example of Embodiment 1

Hereinafter, with reference to FIGS. 3A to 3D, an explanation is given for a second alternative example of Embodiment 1 of the present invention. FIGS. 3A to 3D schematically illustrate the method for manufacturing the resonator of this alternative example. In FIGS. 3A to 3D, the same components as those shown in FIGS. 1A to 1E are given with the same reference numerals. In this alternative example, the steps prior to the step of forming the piezoelectric film 4 on the resonator substrate 1 are the same as those in Embodiment 1 and therefore the explanation thereof is omitted.

Figure 3A:
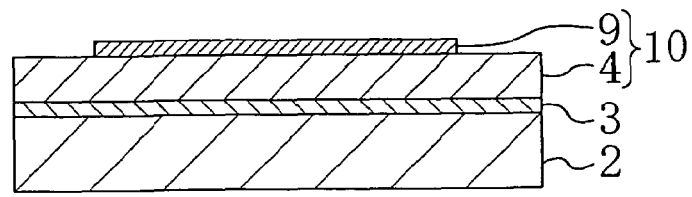
FIGS. 3A to 3D are sectional views illustrating the steps of a method for manufacturing a resonator according to a second alternative example of Embodiment 1 of the present invention.
Figure 3B:
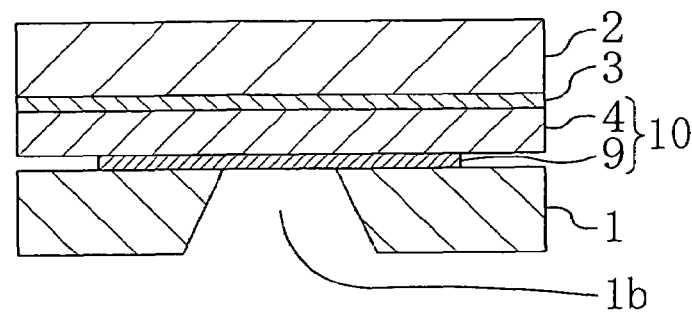

In this alternative example, a conductive film made of Mo is formed as a second thin film 9 on the piezoelectric film 4 by vacuum deposition to provide a resonator film 10 as shown in FIG. 3A. Then, as shown in FIG. 3B, the resonator film 10 is brought into close contact with the main surface of the resonator substrate 1 and then heated at 375° C. for 10 minutes, thereby bonding the resonator film 10 to the main surface of the resonator substrate 1. Thus, an air gap 1b is formed below the resonator film 10.

Figure 3C:
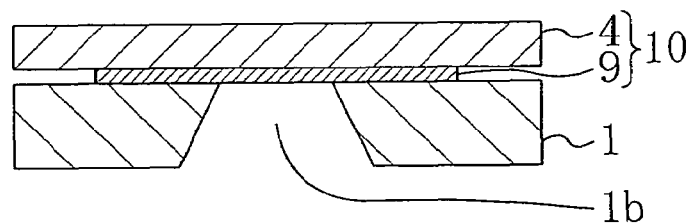
Figure 3D:
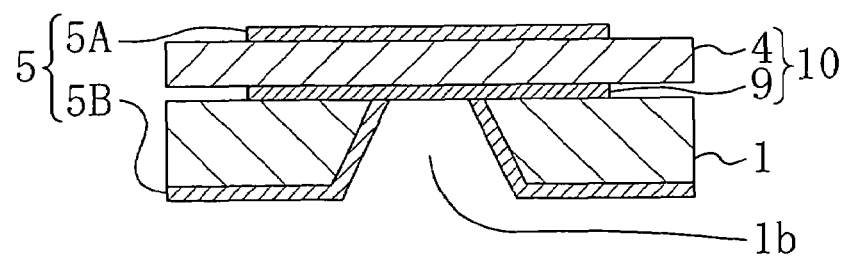

Then, a YAG laser or the like is applied to the preparation substrate 2 to fuse the buffer layer 3, thereby peeling the preparation substrate 2 off the resonator film 10 as shown in FIG. 3C. Finally, as shown in FIG. 3D, an upper electrode 5A made of Mo is formed by common vacuum deposition. In this alternative example, a lower electrode 5B is formed on the rear surface of the resonator substrate 1 to be in contact with the second thin film 9.

In this alternative example, the second thin film 9 of high adhesion is formed on the surface of the resonator film 10. Therefore, the resonator film 10 and the resonator substrate 1 are bonded with improved adhesion stability.

In this alternative example, the second thin film 9 is a conductive film made of Mo, but it may be made of tungsten (W), aluminum (Al), gold (Au), copper (Cu), titanium (Ti), iridium (Ir) or lanthanum hexaboride ($LaB_6$). Or alternatively, the second thin film 9 may be a layered film of Ti and Au. In place of the conductive film, an insulating film made of $SiO_2$ or SiN may be used. Also in this case, the adhesion stability improves in a like manner as the above. The second thin film 9 may be formed of a conductive film and an insulating film formed on the piezoelectric film 4.

Further, in the same manner as in the first alternative example, the first thin film 8 may be formed between the main surface of the preparation substrate 2 and the piezoelectric film 4.

Embodiment 2

Hereinafter, with reference to FIGS. 4A to 4F, an explanation is given for Embodiment 2 of the present invention. FIGS. 4A to 4F schematically illustrate the method for manufacturing the resonator of Embodiment 2. In FIGS. 4A to 4F, the same components as those shown in FIGS. 1A to 1E are given with the same reference numerals.

Figure 4A:
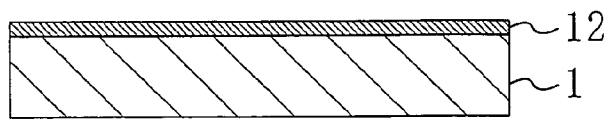
FIGS. 4A to 4F are sectional views illustrating the steps of a method for manufacturing a resonator according to Embodiment 2 of the present invention.
Figure 4B:
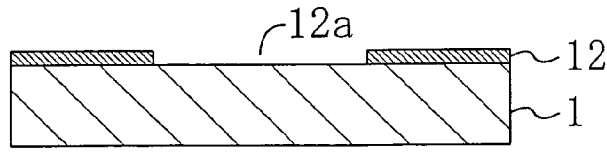

First, as shown in FIG. 4A, an insulating film made of silicon oxide ($SiO_2$) is formed as a third thin film 12 on a resonator substrate 1 made of Si. Then, as shown in FIG. 4B, part of the third thin film 12 is wet-etched using a suitable mask to form an opening 12a.

Figure 4C:
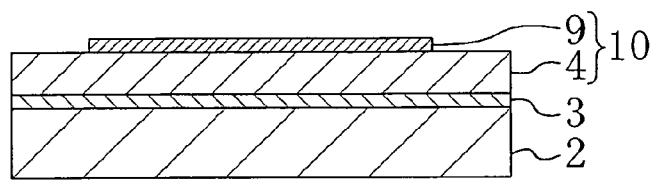

Then, as shown in FIG. 4C, a buffer layer 3 made of GaN is formed on a preparation substrate 2 made of SiC and a piezoelectric film 4 made of AlN and a conductive film made of Mo as a second thin film 9 are deposited thereon to form a resonator film 10.

Figure 4D:
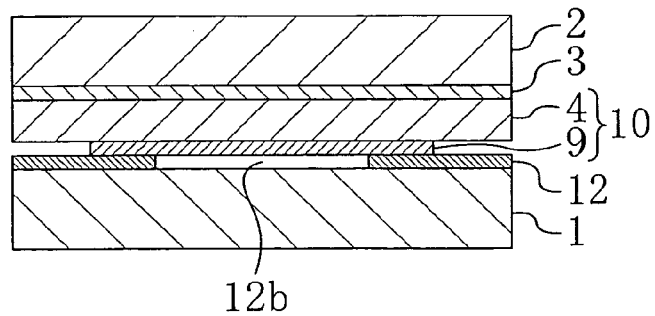

Then, as shown in FIG. 4D, the resonator film 10 is bonded to the resonator substrate 1 provided with the third thin film 12 including the opening 12a, thereby forming an air gap 12b below the resonator film 10.

Figure 4E:
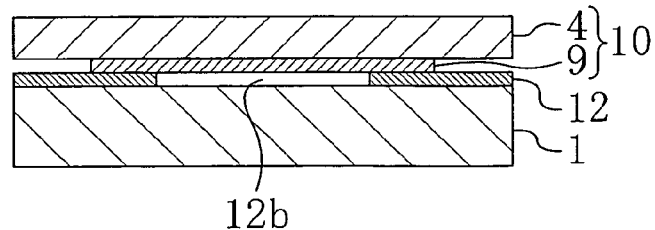

Then, a YAG laser or the like is applied to the preparation substrate 2 to fuse the buffer layer 3, thereby peeling the preparation substrate 2 off the resonator film 10 as shown in FIG. 4E.

Figure 4F:
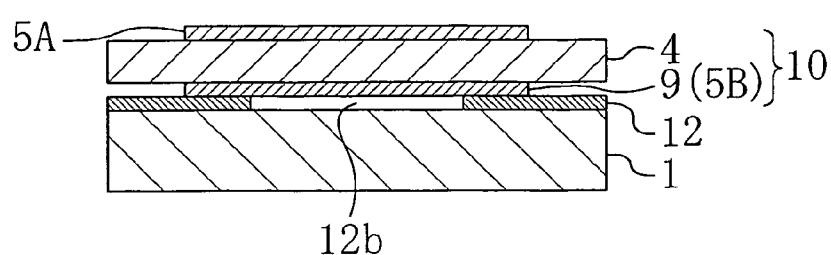

Finally, as shown in FIG. 4F, an upper electrode 5A made of Mo is formed by common vacuum deposition. In this embodiment, the second thin film 9 is used as a lower electrode 5B.

In this embodiment, the third thin film 12 deposited on the resonator substrate 1 is etched to form the opening 12a, thereby providing the air gap 12b. Therefore, the resonator is obtained easily without forming any sacrificial layer and the air gap 12b is provided with high dimensional precision.

In this embodiment, the third thin film 12 is made of $SiO_2$, but it may be made of SiN or the like. Or alternatively, the third thin film 12 may be a conductive film or a layered structure of a conductive film and an insulating film.

In this embodiment, the opening 12a is formed by wet etching, but it may be formed by dry etching or lift-off depending on the material of the third thin film 12.

First Alternative Example of Embodiment 2

Hereinafter, with reference to FIGS. 5A to 5E, an explanation is given for a first alternative example of Embodiment 2 of the present invention. FIGS. 5A to 5E schematically illustrate the method for manufacturing the resonator of this alternative example. In FIGS. 5A to 5E, the same components as those shown in FIGS. 1A to 1E are given with the same reference numerals.

Figure 5A:
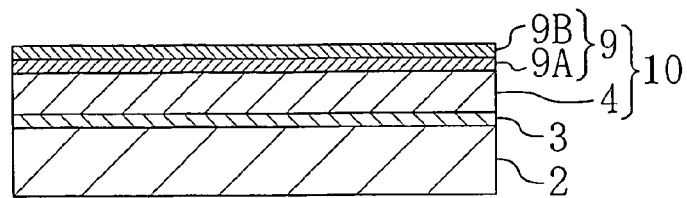
FIGS. 5A to 5E are sectional views illustrating the steps of a method for manufacturing a resonator according to a first alternative example of Embodiment 2 of the present invention.

First, as shown in FIG. 5A, a buffer layer 3 made of GaN is formed on a preparation substrate 2 made of SiC. Then, a piezoelectric film 4 made of AlN and a second thin film 9 including two films, i.e., a conductive film 9A made of Mo and an insulating film 9B made of $SiO_2$, are deposited thereon to form a resonator film 10.

Figure 5B:
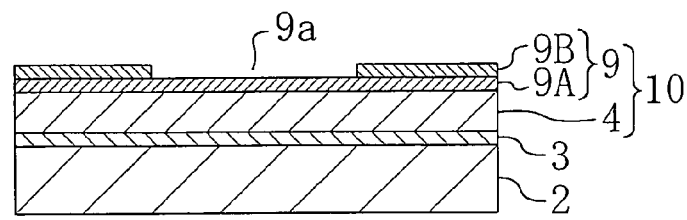

Then, part of the second thin film 9 is etched away using a suitable mask to form an opening 9a in the second thin film 9 as shown in FIG. 5B.

Figure 5C:
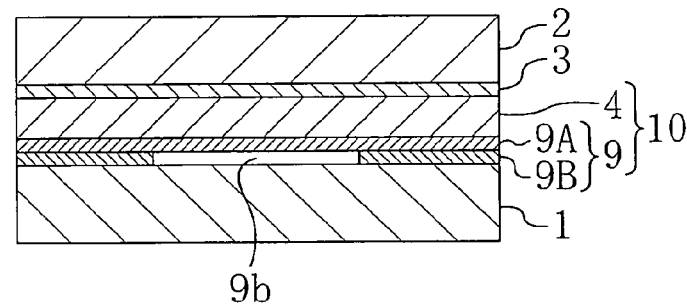

Then, as shown in FIG. 5C, the resonator film 10 provided with the opening 9a is bonded to the main surface of the resonator substrate 1, thereby forming an air gap 9b below the resonator film 10.

Figure 5D:
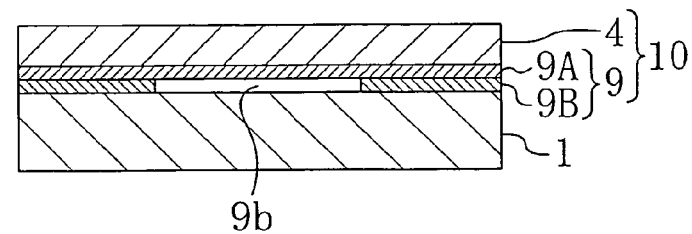

Then, a YAG laser or the like is applied to the preparation substrate 2 to fuse the buffer layer 3, thereby peeling the preparation substrate 2 off the resonator film 10 as shown in FIG. 5D.

Figure 5E:
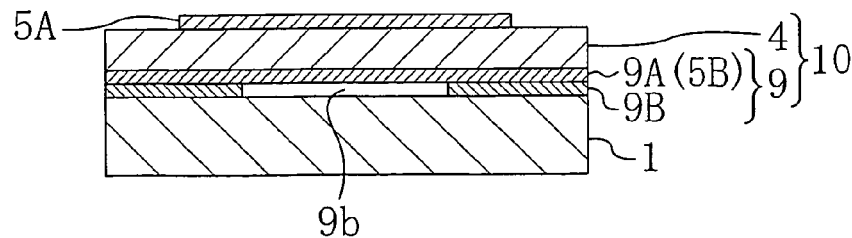

Finally, as shown in FIG. 5E, an upper electrode 5A made of Mo is formed by common vacuum deposition. In this alternative example, the conductive film 9A in the second thin film 9 is used as a lower electrode 5B.

In this alternative example, the second thin film 9 at the outermost surface of the resonator film 10 is etched to form the opening 9a, thereby providing the air gap 9b. Therefore, the resonator is obtained easily without forming any sacrificial layer and the air gap 9b is provided with high dimensional precision.

In this alternative example, the second thin film 9 is formed of the conductive film 9A and the insulating film 9B deposited in this order, but it may be formed of either a conductive film or an insulating film. Further, instead of etching, the opening 9a may be formed by lift-off or the like depending on the material of the thin film.

Second Alternative Example of Embodiment 2

Hereinafter, with reference to FIGS. 6A to 6E, an explanation is given for a second alternative example of Embodiment 2 of the present invention. FIGS. 6A to 6E schematically illustrate the method for manufacturing the resonator of this alternative example. In FIGS. 6A to 6E, the same components as those shown in FIGS. 1A to 1E are given with the same reference numerals.

Figure 6A:
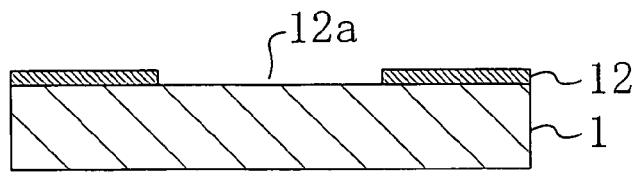
FIGS. 6A to 6E are sectional views illustrating the steps of a method for manufacturing a resonator according to a second alternative example of Embodiment 2 of the present invention.

First, as shown in FIG. 6A, a third thin film 12 having an opening 12a is formed on a resonator substrate 1 made of Si by common electron beam deposition and lift-off. The third thin film 12 includes a 50 nm thick Ti film and a 50 nm thick Au film.

Figure 6B:
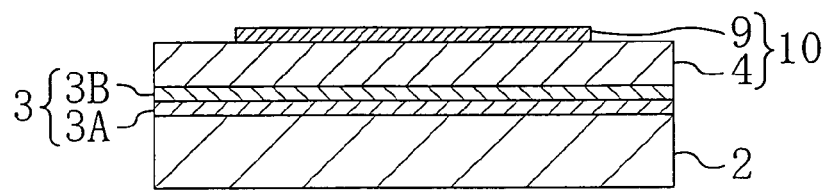

Then, as shown in FIG. 6B, a buffer layer 3 including a 40 nm thick AlN film 3A and a 500 nm thick GaN film 3B is formed on a preparation substrate 2 made of SiC. Then, a 1 μm thick piezoelectric film 4 made of AlN is formed. Further, a second thin film 9 including a 50 nm thick Ti film, a 500 nm thick Au film, a 200 nm thick gold-tin (Au—Sn) alloy film and a 5 nm thick Au film is formed to obtain a resonator film 10.

Figure 6C:
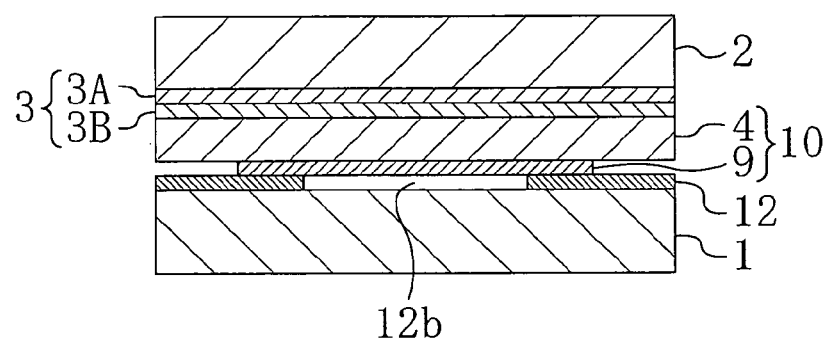

Subsequently, the resonator film 10 is brought into close contact with the third thin film 12 formed on the surface of the resonator substrate 1 and heated at 375° C. for 10 minutes, thereby bonding the resonator film 10 to the resonator substrate 1. Since the resonator film 10 is bonded to the resonator substrate 1 provided with the opening 12a, an air gap 12b is provided below the resonator film 10 as shown in FIG. 6C.

Figure 6D:
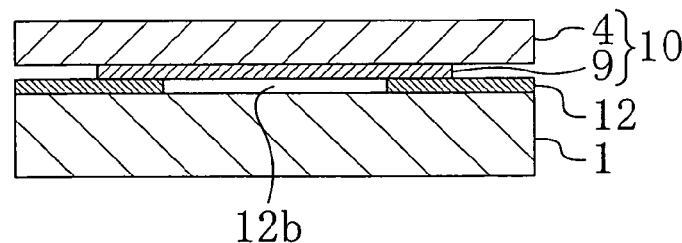

Then, a YAG laser or the like is applied to the preparation substrate 2 to fuse the buffer layer 3, thereby peeling the preparation substrate 2 off the resonator film 10 as shown in FIG. 6D.

Figure 6E:
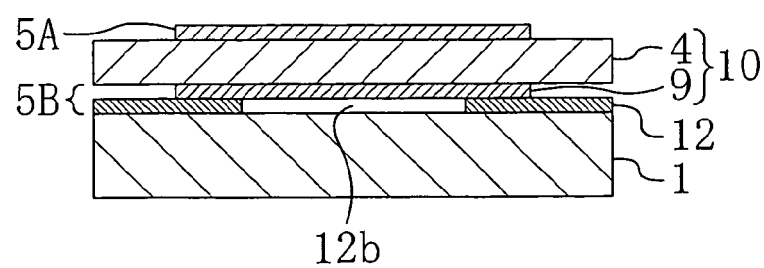

Finally, as shown in FIG. 6E, an upper electrode 5A including a 50 nm thick Ti film and a 200 nm thick Au film is formed on the resonator film 10 by electron beam deposition and lift-off. In this alternative example, the second and third thin films 9 and 12 are used as a lower electrode 5B.

In this alternative example, the Sn-containing second thin film 9 is formed on the surface of the resonator film 10 and the Au-containing third thin film 12 is formed on the surface of the resonator substrate 1. Therefore, upon bonding the resonator film 10 to the resonator substrate 1, Sn contained in the second thin film 9 is dispersed into Au in the third thin film 12 to cause eutectic bonding. Thus, the resonator film 10 is firmly bonded to the resonator substrate 1. Further, since the air gap 12b is formed of the opening 12a which has been provided in advance in the surface of the resonator substrate 1, the resonator is obtained easily without forming any sacrificial layer. Moreover, since the opening 12a is formed by lift-off, the air gap 12b is provided with high dimensional precision.

Embodiment 3

Hereinafter, with reference to FIGS. 7A to 7E, an explanation is given for Embodiment 3 of the present invention.

FIGS. 7A to 7E schematically illustrate the method for manufacturing the resonator of this alternative example. In FIGS. 7A to 7E, the same components as those shown in FIGS. 1A to 1E are given with the same reference numerals.

Figure 7A:
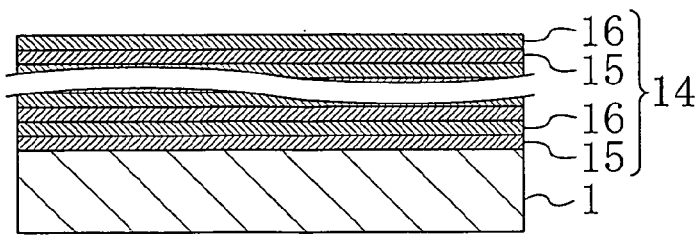
FIGS. 7A to 7E are sectional views illustrating the steps a method for of manufacturing a resonator according to Embodiment 3 of the present invention.

First, as shown in FIG. 7A, 6 fourth thin films 15 which are made of $SiO_2$ and have a low acoustic impedance and 6 fifth thin films 16 which are made of AlN and have a high acoustic impedance are alternately stacked on a resonator substrate 1 made of Si to form a multilayer acoustic film 14. Each of the stacked thin films has a thickness corresponding to one fourth of the resonant wavelength ($\lambda$) of the resonator.

Figure 7B:
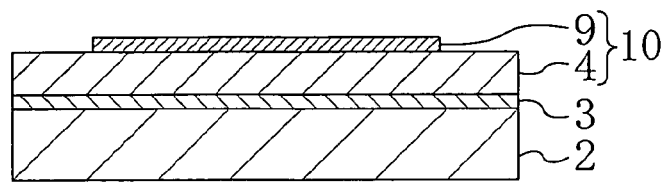

Then, as shown in FIG. 7B, a buffer layer 3 made of GaN is formed on a preparation substrate 2 made of SiC, and then a piezoelectric film 4 made of AlN and a conductive film made of Mo as a second thin film 9 are deposited thereon to form a resonator film 10.

Figure 7C:
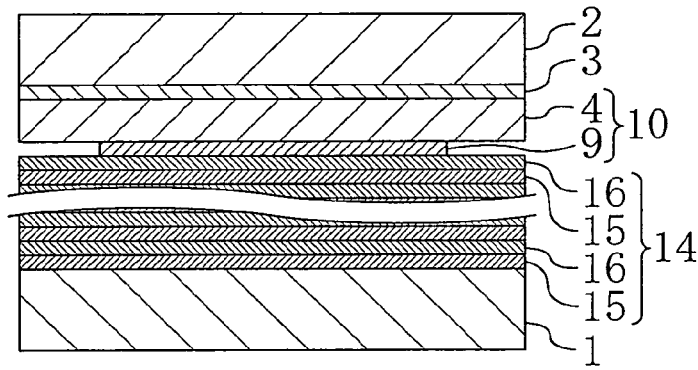

Then, the resonator film 10 is bonded to the resonator substrate 1 on which the multilayer acoustic film 14 has been formed. The obtained structure includes the multilayer acoustic film 14 below the resonator film 10 as shown in FIG. 7C.

Figure 7D:
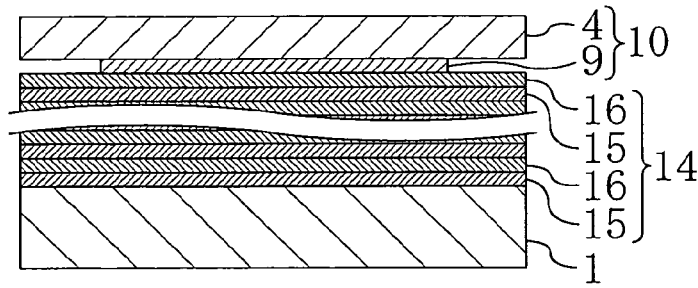

Further, as shown in FIG. 7D, a YAG laser or the like is applied to the preparation substrate 2 to fuse the buffer layer 3, thereby peeling the preparation substrate 2 off the resonator film 10.

Figure 7E:
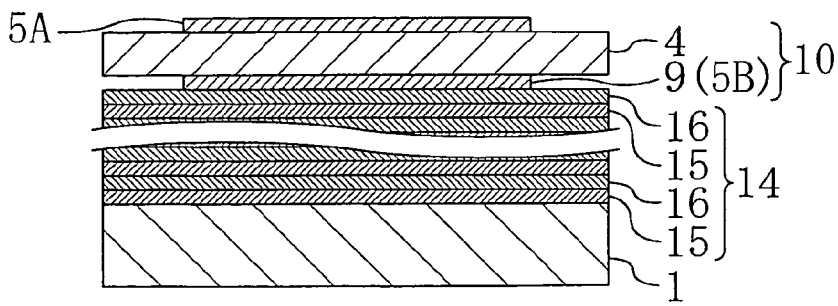
Figure 8A:
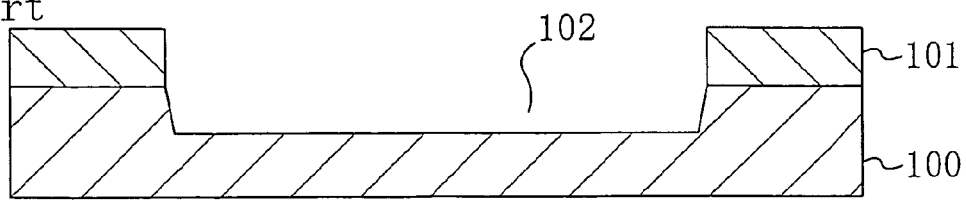
FIGS. 8A to 8E are sectional views illustrating the steps of a method for manufacturing a resonator according to Conventional Example 1.
Figure 8B:
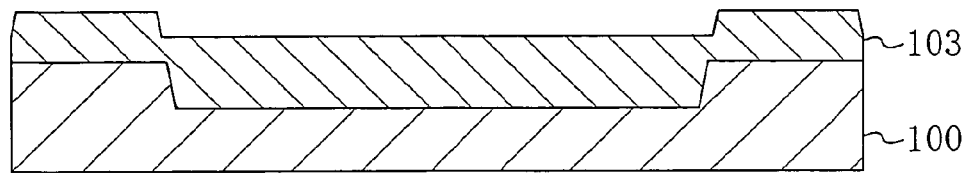
Figure 8C:
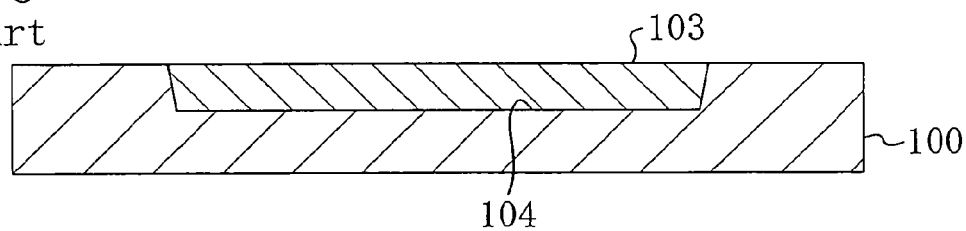
Figure 8D:
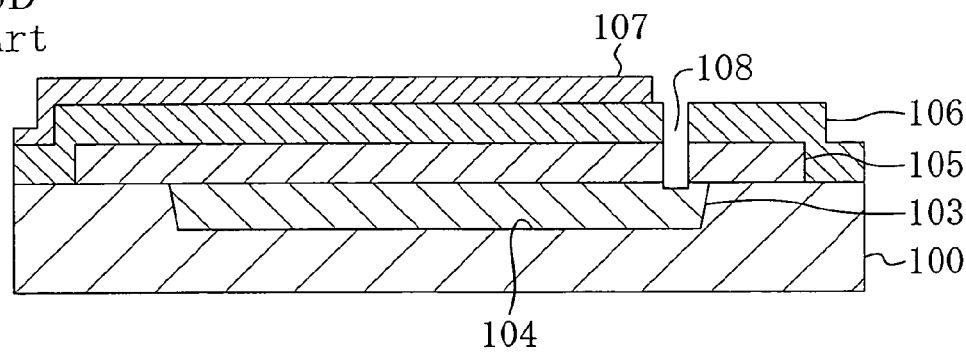
Figure 8E:
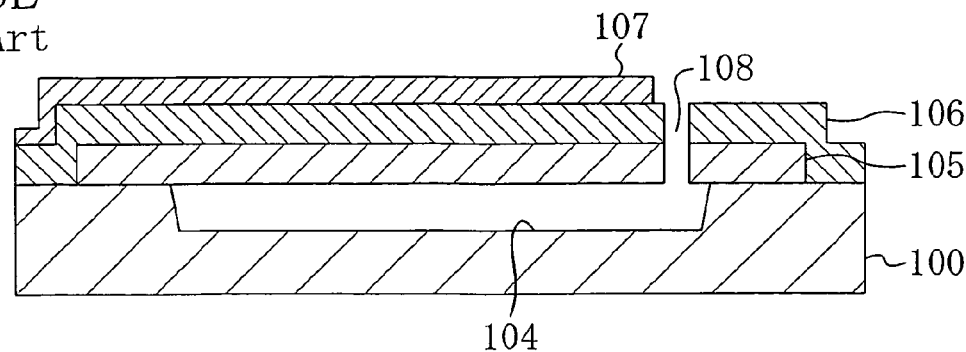
Figure 9A:
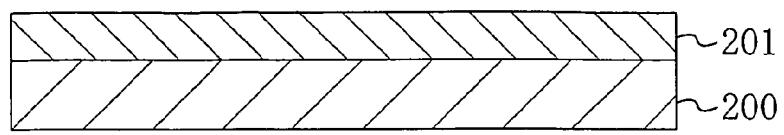
FIGS. 9A to 9F are sectional views illustrating the steps of a method for manufacturing a resonator according to Conventional Example 2.
Figure 9B:
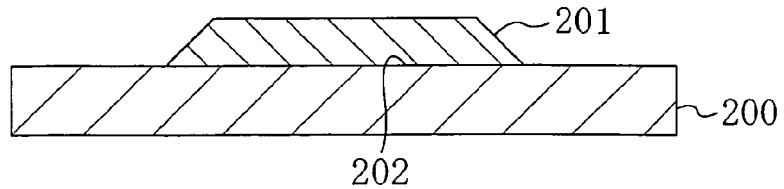
Figure 9C:
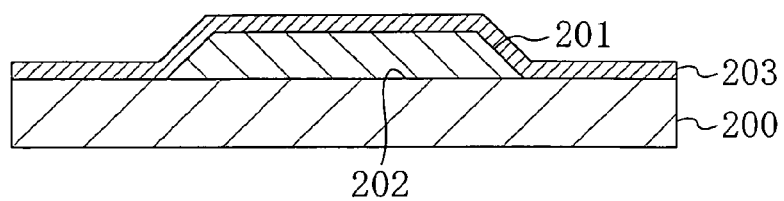
Figure 9D:
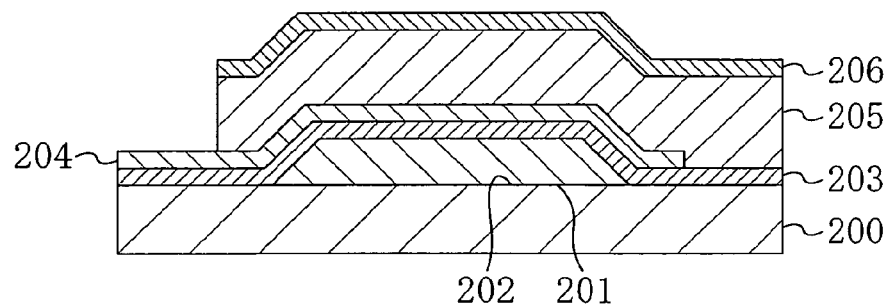
Figure 9E:
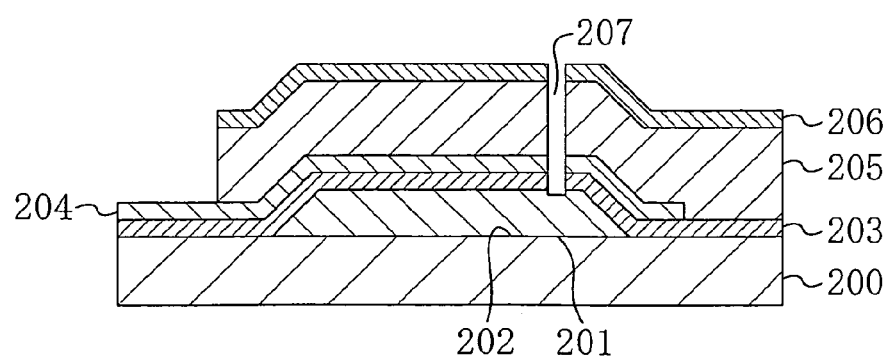
Figure 9F:
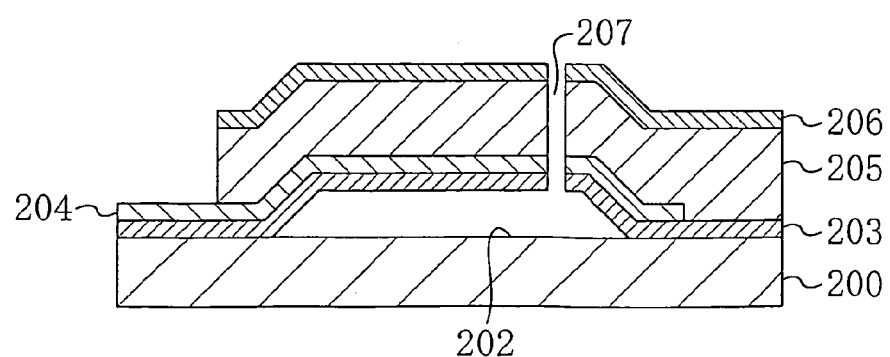

Finally, as shown in FIG. 7E, an upper electrode 5A made of Mo is formed on the resonator film 10 by common vacuum deposition. In this embodiment, the second thin film 9 is used as a lower electrode 5B.

In this embodiment, the multilayer acoustic film 14 is provided below the resonator film 10. Therefore, even if an air gap is not formed below the resonator film 10, elastic waves generated in the piezoelectric film 4 are confined in the piezoelectric film 4. This eliminates the need of forming a through hole in the resonator substrate 1 or etching the thin film formed on the resonator substrate 1 or the resonator film 10 for forming the air gap. Thus, the resonator is obtained with ease.

In this embodiment, the resonator film 10 including the piezoelectric film 4 formed on the preparation substrate 2 is bonded to the multilayer acoustic film 14 formed on the resonator substrate 1 made of Si. Therefore, the multilayer acoustic film and the piezoelectric film are obtained easily with higher quality as compared with the multilayer acoustic film and the piezoelectric film formed in this order on the resonator substrate 1 made of Si. As a result, the resonator is obtained easily with high performance.

In this embodiment, 6 fourth thin films 15 and 6 fifth thin films 16 are alternately stacked. However, if at least 2 fourth thin films 15 and 2 fifth thin films 16 are alternately stacked, the reflectance becomes 90% or more to give the above-described effect. Further, if the piezoelectric film 4 has a thickness corresponding to one half of the resonance wavelength ($\lambda$) of the resonator, elastic waves are confined in the piezoelectric film 4 with high efficiency.

In this embodiment, the fourth thin films 15 are made of $SiO_2$ and the fifth thin films 16 are made of AlN. However, a combination of $SiO_2$ and ZnO, $SiO_2$ and PZT or $SiO_2$ and W may be used to form the thin films 15 and 16.

Also in this embodiment, the first thin film 8 may be interposed between the buffer layer 3 and the piezoelectric film 4 as in the first alternative example of Embodiment 1. This allows obtaining the same effect as that of the first alternative example of Embodiment 1.

In Embodiments 1 to 3 and their alternative examples, the piezoelectric film is deposited by epitaxial growth, but it may be formed by sputtering. In this case, the step of depositing the piezoelectric film is simplified. The piezoelectric film may be made of other materials than AlN such as zinc oxide (ZnO) or lead zirconium titanate (PZT). Further, the buffer layer may be made of aluminum gallium nitride (AlGaN) or the like.

The preparation substrate may be removed by wet-etching any layer sandwiched between the resonator substrate and the preparation substrate. For example, if a buffer layer made of $SiO_2$ is formed, buffered hydrofluoric acid is used as a wet etchant to fuse $SiO_2$, thereby peeling off the preparation substrate easily. In this case, a conductive film made of Mo or Pt is formed on the $SiO_2$ buffer layer and then the piezoelectric film made of AlN or the like is formed thereon. By so doing, the piezoelectric film is given with high quality and the upper electrode is formed with ease.

The preparation substrate may also be removed by dry etching. In this case, the piezoelectric film may be formed directly on the preparation substrate and bonded to the resonator substrate without forming the buffer layer on the preparation substrate. For example, a piezoelectric film of AlN or the like is formed directly on a substrate made of highly crystalline sapphire and then bonded to the main surface of the resonator substrate. Thereafter, the sapphire substrate only is removed by dry etching using a chlorine-based gas such as boron trichloride ($BCl_3$). In this way, the resonator is obtained without forming the buffer layer.

The method for manufacturing the resonator of the present invention allows obtaining a film bulk acoustic resonator with great ease because the air gap is provided without forming any sacrificial layer. Further, since the piezoelectric film is formed by epitaxial growth the obtained piezoelectric film is given with uniform crystallinity and thickness, thereby simplifying the step of adjusting the resonator. Thus, the method of the present invention is useful for manufacturing resonators applicable to filters for electronic circuits, especially film bulk acoustic resonators.

What is claimed is:

1. A method for manufacturing a resonator comprising the steps of:
    forming a piezoelectric film, and a second thin film to be a lower electrode on a preparation substrate in this order;
    forming a third thin film having an opening on a resonator substrate;
    forming an air gap by bonding the second thin film and the third thin film;
    after the step of forming the air gap, removing the preparation substrate; and
    after the step of removing the preparation substrate, forming an upper electrode on the piezoelectric film.

2. The method according to claim 1, wherein
    in the step of forming the second thin film, the second thin film is formed to include Sn, and
    in the step of forming the third thin film, the third thin film is formed to include Au.

3. A method for manufacturing a resonator comprising the steps of:
    forming a piezoelectric film, a conductive film to be a lower electrode, and a first layer having an opening on a preparation substrate in this order;
    forming an air gap by bonding the first layer to a main surface of a resonator substrate;
    after the step of forming the air gap, removing the preparation substrate; and
    after the step of removing the preparation substrate, forming an upper electrode on the piezoelectric film.

4. The method according to claim 3, wherein
    the first layer is a conductive film.

5. The method according to claim 1, wherein
the step of forming the piezoelectric film on the preparation substrate includes forming a buffer layer between the preparation substrate and the piezoelectric film, and
the buffer layer is made of a AlN film and a GaN film formed on the preparation substrate in this order.

6. The method according to claim 1, further comprising the step of:
before the step of forming the piezoelectric film, forming a first thin film on the preparation substrate, wherein
the piezoelectric film is formed to be in contact with the first thin film.

7. The method according to claim 6, wherein
the first thin film is a conductive film to be an upper electrode, and
the second thin film is a conductive film to be a lower electrode.

8. The method according to claim 1, wherein the preparation substrate is removed by wet etching.

9. The method according to chum 1, wherein the preparation substrate is removed by dry etching.

10. The method according to claim 1, wherein
the preparation substrate is made of SiC or sapphire.

11. A method for manufacturing a resonator comprising the steps of:
forming a piezoelectric film on a preparation substrate;
forming a through hole on a resonator substrate;
forming an air gap by bonding the piezoelectric film and the resonator substrate directly;
after the step of forming the air gap, removing the preparation substrate; and
after the step of removing the preparation substrate, forming an upper electrode on the piezoelectric film, and a lower electrode below the piezoelectric film.

12. A method for manufacturing a resonator comprising the steps of:
forming a piezoelectric film, and a second thin film to be a lower electrode on a preparation substrate in this order;
forming a through hole on a resonator substrate;
forming an air gap by bonding the second thin film and the resonator substrate directly;
after the step of forming the air gap, removing the preparation substrate; and
after the step of removing the preparation substrate, forming an upper electrode on the piezoelectric film.

13. A method for manufacturing a resonator comprising the steps of:
forming a piezoelectric film, and a second thin film to be a lower electrode on a preparation substrate in this order;
forming a concave on a resonator substrate;
forming an air gap by bonding the second thin film and the resonator substrate directly;
after the step of forming the air gap, removing the preparation substrate; and
after the step of removing the preparation substrate, forming an upper electrode on the piezoelectric film.

* * * * *